(12) United States Patent
Azuma et al.

(10) Patent No.: US 7,542,317 B2
(45) Date of Patent: Jun. 2, 2009

(54) SEMICONDUCTOR DEVICE AND POWER CONVERSION APPARATUS USING THE SAME

(75) Inventors: Katsunori Azuma, Hitachi (JP); Toshiaki Morita, Hitachi (JP); Hiroshi Hozoji, Hitachiota (JP); Kazuhiro Suzuki, Mito (JP); Toshiya Satoh, Hitachiota (JP); Osamu Otsuka, Atsugi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/501,784

(22) Filed: Aug. 10, 2006

(65) Prior Publication Data

US 2007/0051974 A1 Mar. 8, 2007

(30) Foreign Application Priority Data

Aug. 26, 2005 (JP) ............................. 2005-245232

(51) Int. Cl.
*H02M 7/537* (2006.01)
(52) U.S. Cl. ................... 363/131; 363/141; 363/123; 363/71; 257/500; 257/E29.027; 257/E29.066; 257/E29.197; 257/E21.382; 257/177
(58) Field of Classification Search ............ None
See application file for complete search history.

(56) References Cited

U.S. PATENT DOCUMENTS 6,822,850 B2 * 11/2004 Pfeifer et al. ............... 361/611

FOREIGN PATENT DOCUMENTS

| JP | 11-4584 | 1/1999 |
| JP | 2001-332688 | 11/2001 |
| JP | 2003-197858 | 7/2003 |

* cited by examiner

*Primary Examiner*—Fei Fei Yeung Lopez
(74) *Attorney, Agent, or Firm*—Crowell & Moring LLP

(57) ABSTRACT

The power conversion apparatus uses the semiconductor device. Said semiconductor device includes a first group of power semiconductor elements at least one of which is electrically connected between a first potential and a third potential, a second group of power semiconductor elements at least one of which is electrically connected between a second potential and the third potential, and a third group of power semiconductor elements at least one of which is electrically connected between the first potential and the third potential. The second group is disposed between the first group and third group.

Thereby, a low-loss semiconductor device having both inductance reducibility and heat generation balancing capability and also an electric power conversion apparatus using the same is provided.

7 Claims, 19 Drawing Sheets

SEMICONDUCTOR DEVICE AND POWER CONVERSION APPARATUS USING THE SAME

CLAIM OF PRIORITY

The present application claims priority from Japanese application serial no. 2005-245232, filed on Aug. 26, 2005, the content of which is hereby incorporated by reference into this application.

FIELD OF THE INVENTION

The present invention relates in general to semiconductor devices and electrical power conversion apparatus using the same, and more particularly to a semiconductor device of the low-loss heat dispersion type adaptable for use in movable bodies, such as land vehicles or else, and power conversion apparatus using this device.

BACKGROUND OF THE INVENTION

In recent years, development is advancing of development of switchable large-current power semiconductor circuit elements. A power conversion apparatus configured from a semiconductor device using the power elements is expected to offer the ability to efficiently supply electric power to a load, such as a motor or else. Accordingly, such apparatus is widely employed for the purpose of motor-driving of movable bodies, such as electric trains or automobiles or like vehicles. In particular, in hybrid cars, an engine and an electric motor are in combined use for enabling creation of increased torque from low rotations of the motor and the storage of a regenerative energy to a battery module. Adding thereto an idle stop system permits achievement of high fuel consumption ratios while reducing production of carbon dioxides ($CO_2$).

Power semiconductor circuit elements for use in power converters are faced with a problem as to the presence of steady energy losses due to current flow and switching losses in switching events. In order to increase the efficiency of the power conversion, development is advancing of a power semiconductor circuit element with reducibility of these two kinds of losses along with a semiconductor device and power converter using the same.

Generally, power semiconductor circuit elements are such that as the withstanding voltage at the time of turn-off becomes higher, the thickness of a circuit element increases due to relaxation of an internal electric field of semiconductor. In view of this, in order to lower the loss, it is important to use a power semiconductor element with its breakdown voltage as low as possible.

However, upon switching of a power converter, the voltage being applied to a power semiconductor circuit element steeply rises up in potential due to a rapid current change thereof and also the presence of parasitic inductance components at electrical interconnect wires. To provide the robustness against such rise-up or "jumping" voltage, the power converter is designed to use a power semiconductor circuit element having its voltage withstandability that is approximately two times greater than the power supply voltage. In addition, in order to suppress the jumping voltage, the development is advancing for a so-called low-inductance semiconductor device with reduced wire parasitic inductance and also a power converter using the same.

One prior known structure is disclosed in Japanese Patent Laid-open No. Hei 11 (1999)-4584, which has a linear array of power semiconductor circuit elements on the same substrate surface while letting a planar multilayered wiring conductor be provided in parallel with the array. Stacking is done to permit electrical currents to flow in the planar wiring conductor so that these are opposite in direction to each other to form a reciprocative current flow path, thereby attempting to realize electrical interconnect wires of low inductance. It is also taught by said Patent Document that the wires of an inverter device are stacked in a way which follows: P line conductors on the positive polarity side are formed in a lowermost layer, output-side U line conductors are in an intermediate layer, and negative polarity-side N line conductors are in an uppermost layer.

Additionally, Japanese Patent Laid-open No. 2001-332688 discloses therein a technique for designing each of the positive P line conductors, output-side U line conductors and negative N line conductors by a "wide" electrode with its width greater than the thickness thereof, with respect to two power semiconductor circuit elements. This Patent Document also discloses an approach to achieving low inductance by stacking or laminating the P-, U- and N-line conductors in an order of P-U-N.

Japanese Patent Laid-open No. 2003-197858 discloses therein a technique for realizing low inductance by stacking, for layout, external connection electrodes of the positive, negative and output sides between more than two positive and negative side power semiconductor circuit elements.

SUMMARY OF THE INVENTION

However, the above-noted prior art approaches suffer from a problem that the heat generated is locally concentrated within semiconductor devices depending upon an operation state of power converter because of the fact that the positive side semiconductor circuit elements are disposed while being organized into a group whereas the negative semiconductor elements are in a separate group.

For example, when a land vehicle accidentally rides on a curbstone or the like, its tire is fixed to cause a motor to be fixed, resulting in the inverter going into an overload state. This state is called the motor lock state. In this motor lock state, an overcurrent rushes to flow in only a one-side power semiconductor element(s) of the inverter. Thus, the most severe condition takes place in a sense of heat.

In this motor lock state, in case the semiconductor device has a layout in which one-side power semiconductor circuit elements are gathered together, the heat generated exhibits local concentration within the semiconductor device. Once the device goes into this state, its circuit element temperature becomes higher than that in ordinary acceleration events. This brings a need to employ a structure with enhanced heat releasability, especially for those used in hybrid cars.

However, the above-noted prior art power semiconductor circuit elements fail to have the layout that takes account of well-balanced heat generation.

MEANS FOR SOLVING THE PROBLEMS

To avoid the foregoing problems faced with the prior art, in accordance with one aspect of this invention, a semiconductor device is provided which includes a first semiconductor element group with at least one first power semiconductor circuit element (IGBT 1) being electrically connected between a first potential (positive voltage) and a third potential (output voltage), a second semiconductor element group with at least one second power semiconductor circuit element (IGBT 2) being electrically connected between a second potential (negative voltage) and the third potential (output voltage), and a third semiconductor element group with at least one third power semiconductor circuit element (IGBT 1) being electrically connected between the first potential (positive voltage) and the third potential (output voltage), wherein the second semiconductor element group is disposed between the first semiconductor element group and the third semiconductor element group.

In accordance with another aspect of the invention, a semiconductor device includes a first semiconductor element group with at least one first power semiconductor circuit element (IGBT 1) being electrically connected between a first potential (positive voltage) and a third potential (output voltage), a second semiconductor element group with at least one second power semiconductor circuit element (IGBT 2) being electrically connected between a second potential (negative voltage) and the third potential (output voltage), and a third semiconductor element group with at least one third power semiconductor circuit element (IGBT 1) being electrically connected between the first potential (positive voltage) and the third potential (output voltage), a fourth semiconductor element group with at least one fourth power semiconductor circuit element (IGBT 2) being electrically connected between the second potential (negative voltage) and the third potential (output voltage), and a multilayer structure having an electrode plate for electrical connection to the first potential (positive voltage) and an electrode plate for electrical connection to the second potential (negative voltage), which electrodes are stacked over each other with an insulator interposed therebetween, wherein the first semiconductor element group and the second semiconductor element group are disposed in parallel with the multilayer structure on a one side thereof, and wherein the third semiconductor element group and the fourth semiconductor element group are disposed in parallel with the multilayer structure on the remaining side opposite to the above-noted one side of the multilayer structure.

In accordance with a further aspect of the invention, an electrical power conversion apparatus is provided, which includes a plurality of semiconductor switching devices (semiconductor devices 29) each having a first semiconductor element group with at least one first power semiconductor element (IGBT 1) being connected between a first terminal (positive polarity side terminal 5a) and a third terminal (output terminal 6a), a second semiconductor element group with at least one second power semiconductor element (IGBT 2) being connected between a second terminal (negative polarity side terminal 7a) and the third terminal (output terminal 6a), and a third semiconductor element group with at least one third power semiconductor element (IGBT 1) being connected between the first terminal (positive terminal 5a) and the third terminal (output terminal 6a), and a capacitor coupled between the first terminal (positive terminal 5a) and the second terminal (negative terminal 7a). The second semiconductor element group is disposed between the first and third semiconductor element groups. The first terminal (positive terminal 5a) and the capacitor are electrically connected together by use of a first plate-shaped conductor. The second terminal (negative terminal 7a) and the capacitor are electrically connected together by using a second plate-shaped conductor. The first and second plate-shaped conductors are stacked or laminated with an insulator being interposed therebetween.

According to this invention, it is possible to provide a semiconductor device of low inductance and a power conversion apparatus using the same.

DESCRIPTION OF THE PREFERRED EMBODIMENTS

Figure 1:
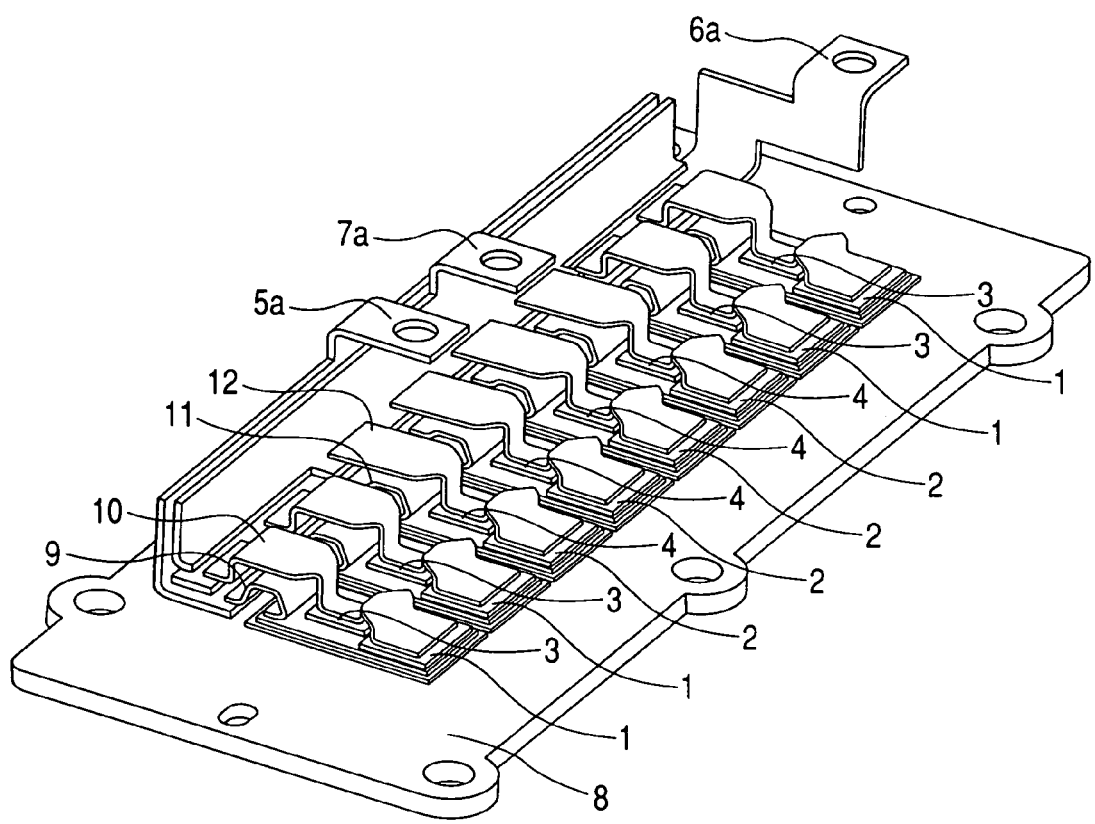
FIG. 1 is a perspective view of a semiconductor device in accordance with a first embodiment of the present invention.

Currently preferred embodiments of the present invention will be described in detail with reference to the accompanying drawings below.

Embodiment 1

A configuration and operation of a semiconductor device in accordance with a first embodiment of this invention will be set forth while referring to FIGS. 1 to 4 and FIGS. 21 and 22.

An explanation will first be given of a circuit configuration for inductance reduction. See FIG. 21, which is a circuit diagram of a power conversion apparatus as connected to a DC power supply and a load. Shown herein is a case where the power converter circuitry includes switching power semiconductor circuit elements, e.g., insulated-gate bipolar transistors (IGBTs). Also note that several inductance components are illustrated in the circuit diagram for the purpose of considering electrical currents flowing during switching operations.

A power conversion apparatus 30 is connected to DC power supply 16 by inductance components 18 and 19 of a cable. Based on a command from a control device (not shown), an IGBT 1 of upper arm and an IGBT 2 of lower arm perform switching operations, whereby control is done to apply a voltage to the load and an inductance 22 of load connection cable.

The power converter 30 is configured to include a capacitor 17 and a semiconductor device 29, which are in the form of a circuit with connection of inductances 20 and 21 of an interconnect conductor. The semiconductor device 29 has a series connection of IGBT 1 for output of a high voltage and IGBT 2 for output of a low voltage. A potential at a connection node of the IGBT 1 and IGBT 2 is output by an output terminal 6*a* to a load inductance 22.

In the semiconductor device 29, the IGBTs 1 and 2 are serially connected between a positive polarity side terminal 5*a* and a negative polarity side terminal 7*a*. Provided between these positive and negative terminals 5*a* and 7*a* are an inductance 23 of positive terminal 5*a*, an inductance 24 of negative terminal 7*a*, and internally coupled inductances 25, 26, 27 and 28 of interconnect conductor. Additionally the IGBTs 1-2 are each associated with a current-circumfluent or "backflow" diode 3, 4 that is rendered operative upon turn-off of IGBT, which diode is coupled in anti-parallel thereto.

First suppose that the IGBT 1 turns on whereas IGBT 2 turns off. A current flows from the DC power supply 16 to the load 22 through the cable inductance 18, conductor inductance 20, inductances 23 and 25 within the semiconductor device 29, IGBT 1, and inductance 26. The current flow path at this time is indicated by arrow in FIG. 21.

Next, assume that the IGBT 1 is driven to turn off while the above-noted current is flowing. At this time, such current does not become zero instantaneously because the cable inductance 18 and the inductance 22 of load 22 are large in value, so it acts as a current source. As a result of this, the current that has flown the cable changes to flow along another flow path extending via the capacitor 17, inductances 21, 24, 28 and current backflow diode 4 toward the load 22. The current flow path at this time is indicated by arrow of broken line in FIG. 21.

Figure 21:
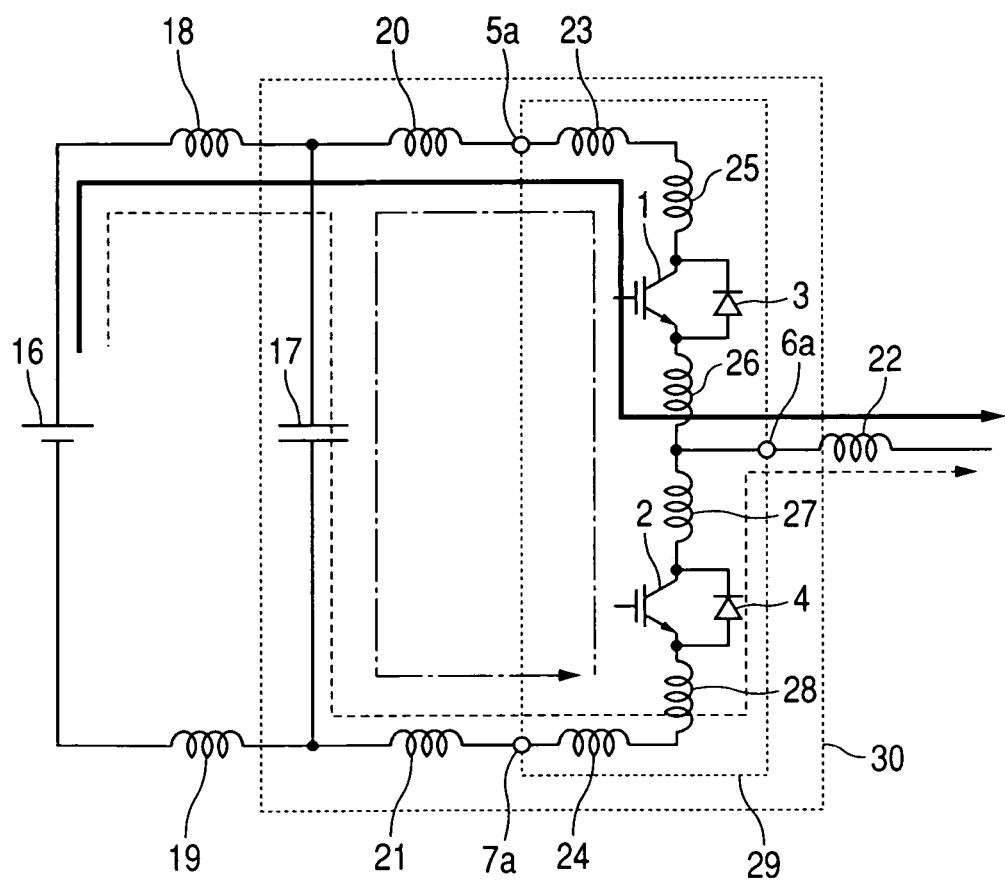
FIG. 21 is a circuit diagram of a currently available power conversion apparatus.

Considering this current flow change at the time of switching, a rush current flows as indicated by a loop of dash-and-dot line in FIG. 21. A circuit of this dash-and-dot line is called a main circuit. Reducing this main circuit's inductance L makes it possible to lower a jump-up voltage V=L·di/dt, which occurs due to a current change di/dt during switching.

This means that it is possible to reduce thermal losses in switching events and also possible to use circuit elements that are low in withstand voltage—i.e., those elements of low steady loss. Consequently, lowering the inductance L of the main circuit contributes to the reduction of heat generation of the power converter 30.

Figure 2:
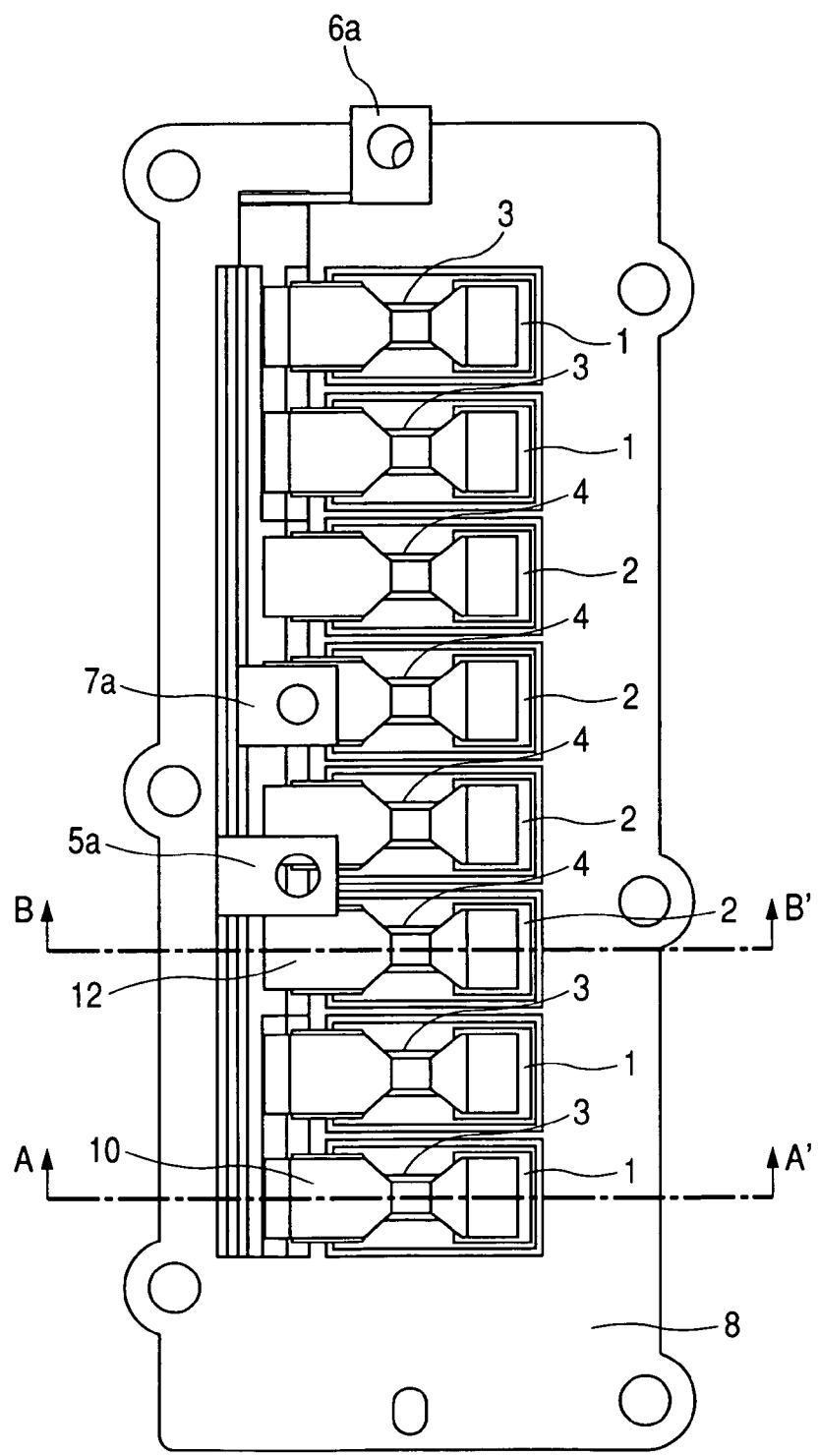
FIG. 2 is a top view of the semiconductor device in the first embodiment of this invention.
Figure 3:
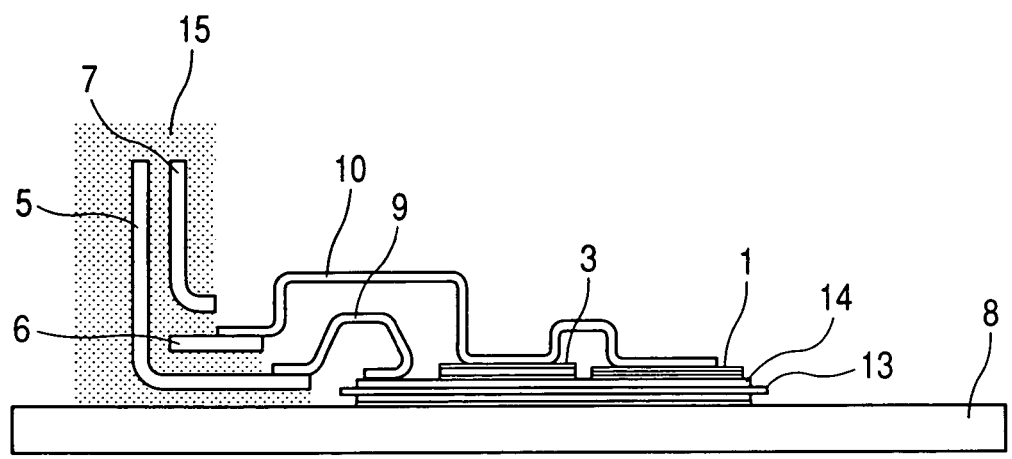
FIG. 3 is a cross-sectional view of the semiconductor device in the first embodiment of the invention as taken along line A-A' of FIG. 2.
Figure 4:
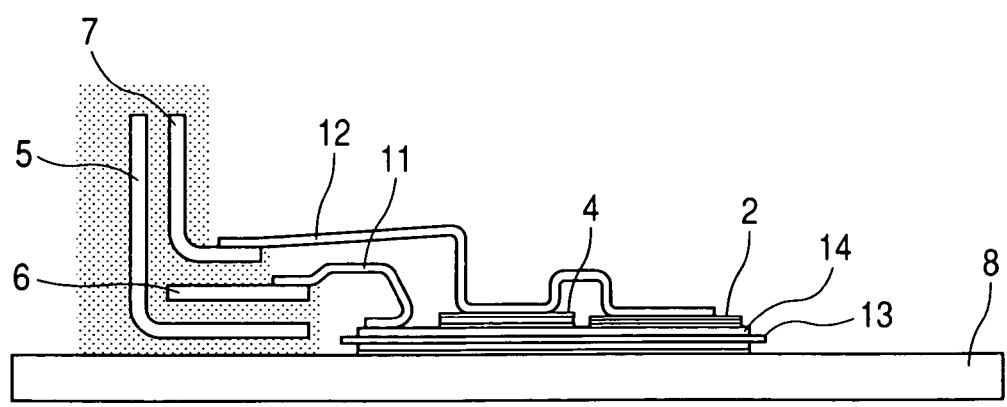
FIG. 4 is a cross-section of the semiconductor device of the first embodiment of the invention as taken along line B-B' in FIG. 2.

A perspective view of the semiconductor device 29 is shown in FIG. 1, which employs a group of four separate high voltage side (positive polarity side) circuit elements and a group of four low voltage side (negative polarity side) circuit elements. A top view of the device 29 is illustrated in FIG. 2. Its high voltage side (positive side) and low voltage side (negative side) cross-sectional structures are depicted in FIGS. 3 and 4, respectively.

The semiconductor device 29 includes an electrically insulative or dielectric substrate 13 having thereon a conductive wiring pattern 14 which is fixedly attached by soldering to a cooling metal plate 8. Soldered on the substrate 13 are IGBTs 1 for use as high voltage side switching elements and IGBTs 2 for use as low voltage side switching elements.

A positive polarity side terminal 5*a* for connection to the high voltage side and an output terminal 6*a* and a negative polarity side terminal 7*a* for connection to the low voltage side are formed at portions of a positive side conductive plate 5, output conductive plate 6 and negative side conductive plate 7. Adjacent ones of these plates 5 to 7 are disposed to oppose each other with at least portions thereof, with an insulator 15 (not shown in FIGS. 1-2) interposed therebetween.

Connection between the positive terminal 5*a*, output terminal 6*a* and negative terminal 7*a* on one hand and the IGBTs 1-2 and diodes 3-4 on the other hand is made by thin plate-shaped interconnect conductors 9, 10, 11 and 12. Owing to this conductor layout, the inductance components 23-24, 25-26 and 27-28 of FIG. 21 become lower in inductance value in the form of a forward/backward current flowing on two flat plates, thereby enabling reduction of the main-circuit inductance L stated supra.

One feature of the illustrative embodiment is as follows. In order to lower the inductance to thereby suppress temperature increase of the semiconductor circuit elements due to thermal dispersion effects, the on-substrate layout of the high voltage side IGBTs 1 and low voltage side IGBTs 2 is arranged so that a linear array of two high voltage side IGBTs 1, four low voltage side IGBTs 2 and two high voltage side IGBTs 1 is disposed in the elongate direction of a strip-shaped thin conductor. More specifically, the plurality of high voltage side power semiconductor elements are divided into more than two groups or "queues," which are laid out in the elongate direction of the strip-like thin conductor while interposing therebetween the low voltage side power semiconductor elements.

Figure 22:
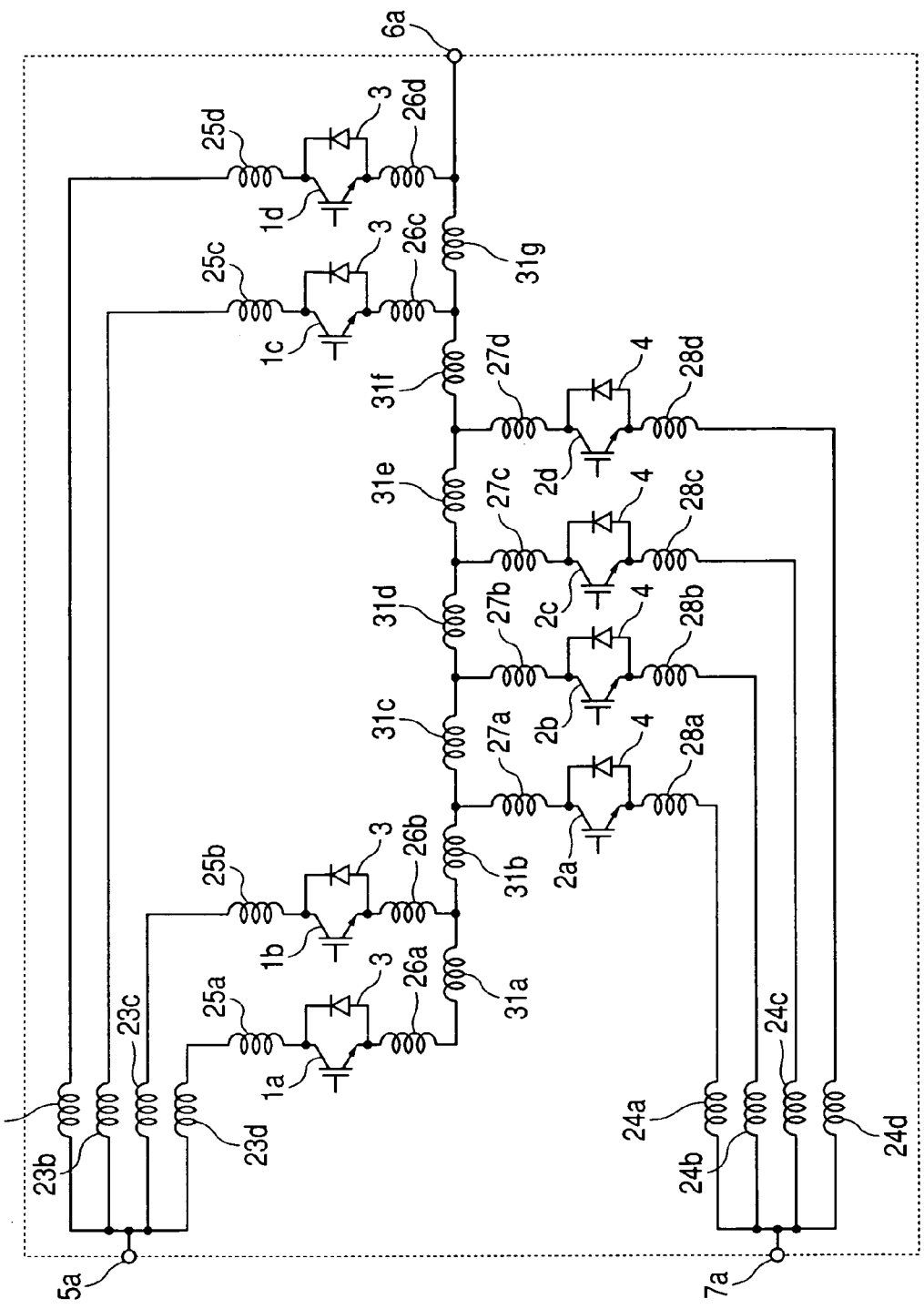
FIG. 22 is a circuit diagram of the semiconductor device of the first embodiment of the invention.

A circuit diagram of this parts-mount structure is shown in FIG. 22. Inductance components 31*a*-31*g* of output conductor shown herein are the inductances as created between respective IGBTs or at an output-use conductor for connection between respective backflow diodes. Although the output-use conductor is structured so that a forward/backward current flows therein and thus no inductance takes places, a leakage inductance appears due to the presence of a distance corresponding to the thickness of dielectric material. This inductance value is almost the same since IGBTs are disposed on the dielectric substrate at equal intervals. Let this inductance value be Lo. Considering some of the main-circuit inductances, i.e., those in the semiconductor device 29, the inductance value differs depending on which pair of the four IGBTs 1a-1d and four IGBTs 2a-2d experiences the flow of a current.

The interconnect conductor has inductance components 25a-25d, 26a-26d, 27a-27d and 28a-28d. High voltage side conductor's inductances are indicated by 23a-23d, while low voltage side conductor inductances are by 24a-24d. Assume here that the high voltage side inductances are equal in value with respect to the four high voltage side IGBTs 1a-1d and backflow diodes as coupled in parallel thereto whereas the low voltage side inductances are equal in value relative to four low voltage side IGBTs 2a-2d and their associated parallel-coupled backflow diodes.

When considering a transit current flow path during switching as indicated by dash-dot line in FIG. 21, the circuit of FIG. 22 is symmetrical relative to the inductance 31d. In light of this symmetry, there will be considered a half flow path having the IGBTs 1a-1b and their associated backflow diodes along with IGBTs 2a-2b and backflow diodes thereof.

First, a current flow path with its inductance becoming minimized is the route along which a current flows in the IGBT 1b or its backflow diode and in IGBT 2a or its backflow diode. Alternatively, a current flow path with the maximum inductance is the route along which a current flows in the IGBT 1a or its backflow diode and in IGBT 2b or its backflow diode. A difference therebetween is equivalent to the inductance difference of interconnect conductor. When taking into consideration the connection inductances only, the former is represented by Lo whereas the latter is given by 3Lo.

Figure 25:
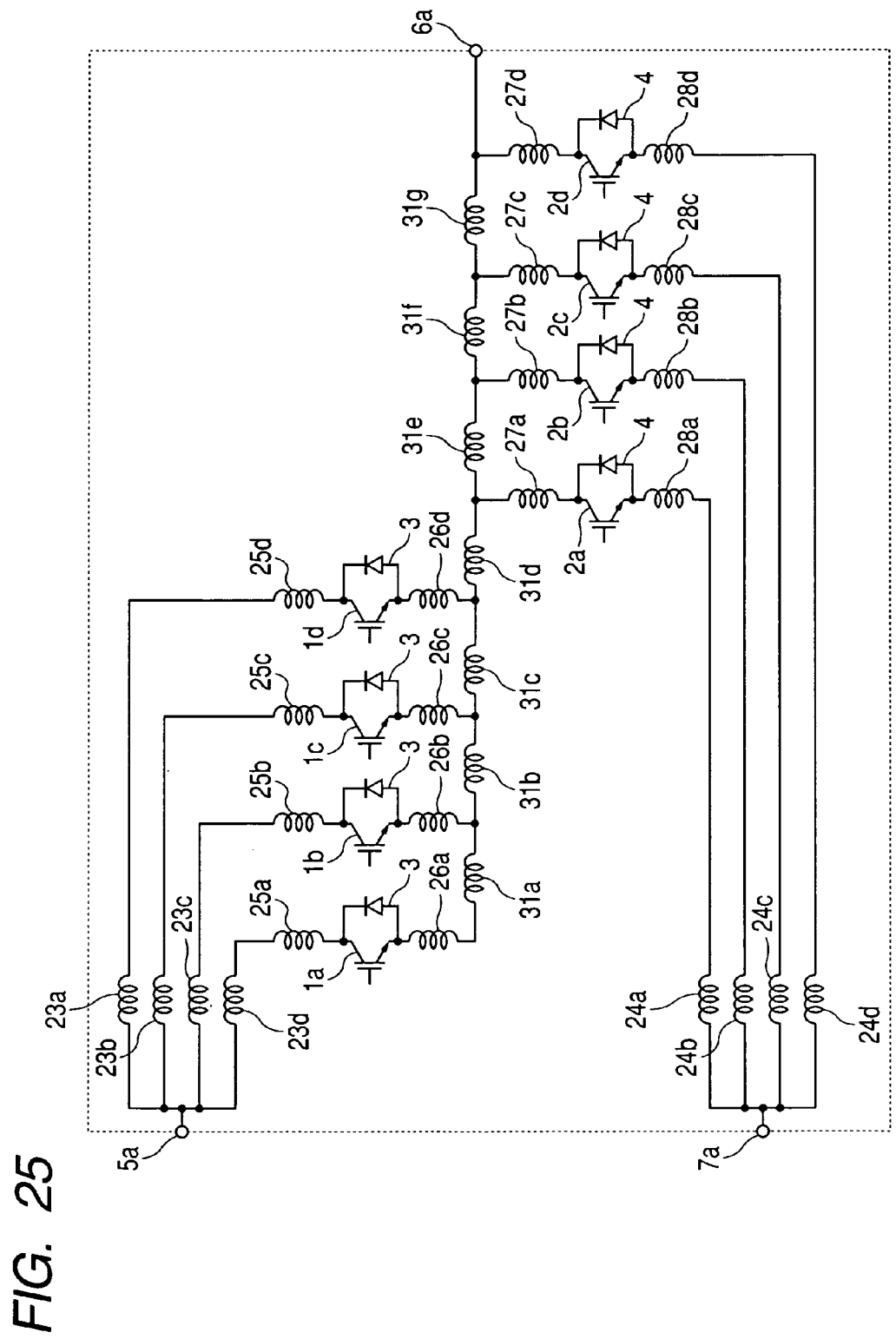
FIG. 25 is a circuit diagram of one prior art semiconductor device.

On the contrary, a configuration of prior art circuitry without the divisional grouping of high and low voltage side IGBTs is shown in FIG. 25. In the case of this circuit, when considering the inductance-minimized current flow path, the route of the IGBT 1d or its backflow diode and IGBT 2a or its backflow diode is in minimum, and the interconnect conductor's inductance is Lo. Regarding the inductance-maximized flow path, the route of the IGBT 1a or its backflow diode and IGBT 2d or its backflow diode is in maximum, and the interconnect conductor's inductance is 7Lo. Consequently, the average inductance increases in value, and transient currents tend to concentrate at a central portion, resulting in the heat of switching losses concentrating to the central part. This causes fluctuation of the maximum temperature of each power semiconductor circuit element.

In this embodiment, the multiple high voltage side power semiconductor circuit elements are organized into more than two spaced-apart groups which are disposed in the elongate direction of the strip-like thin conductor, while letting the low voltage side power semiconductor elements be interposed between the groups. Thus it is possible to achieve a low-inductance semiconductor device and a power converter using this device.

Embodiment 2

Figure 5:
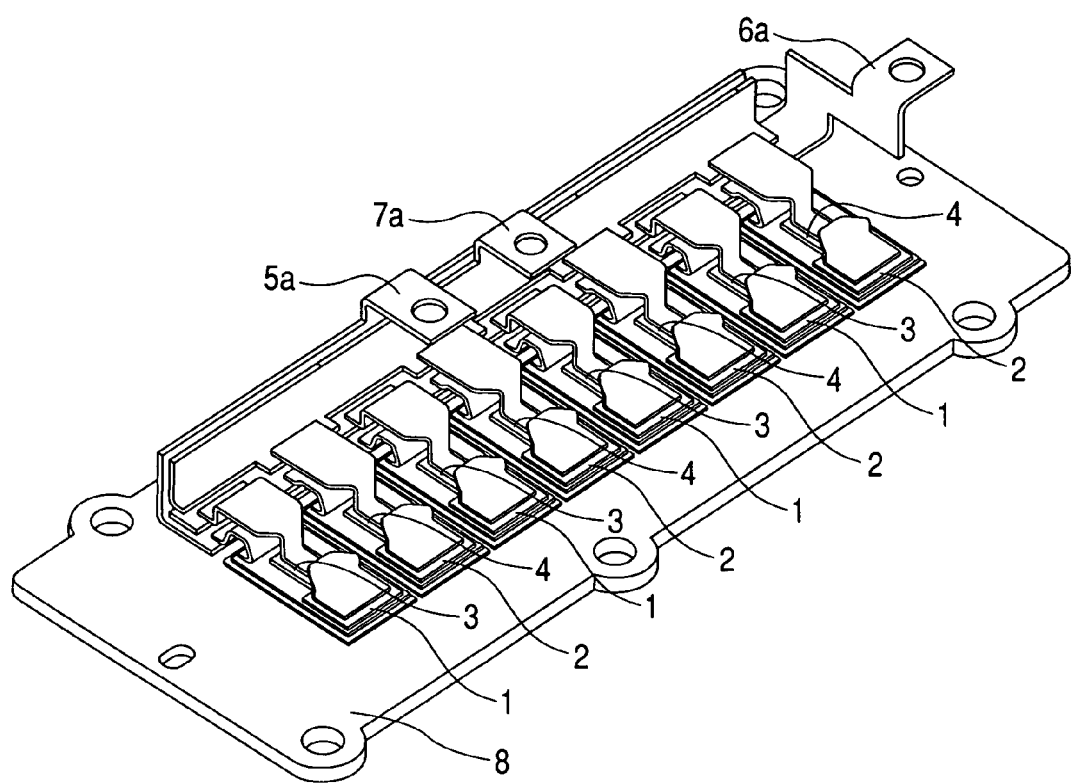
FIG. 5 is a perspective view of a semiconductor device in accordance with a second embodiment of the invention.
Figure 6:
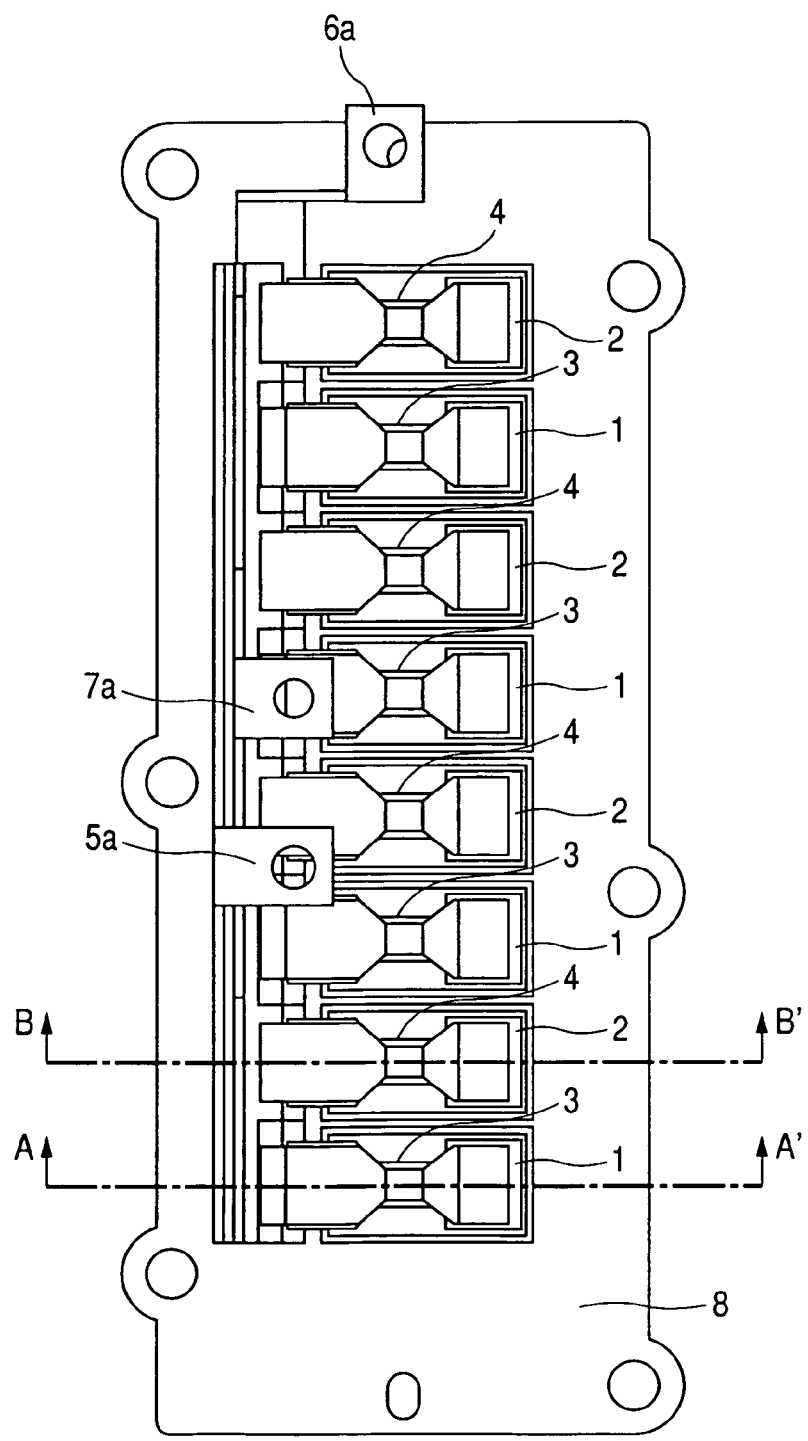
FIG. 6 is a top view of the semiconductor device of the second embodiment of the invention.
Figure 7:
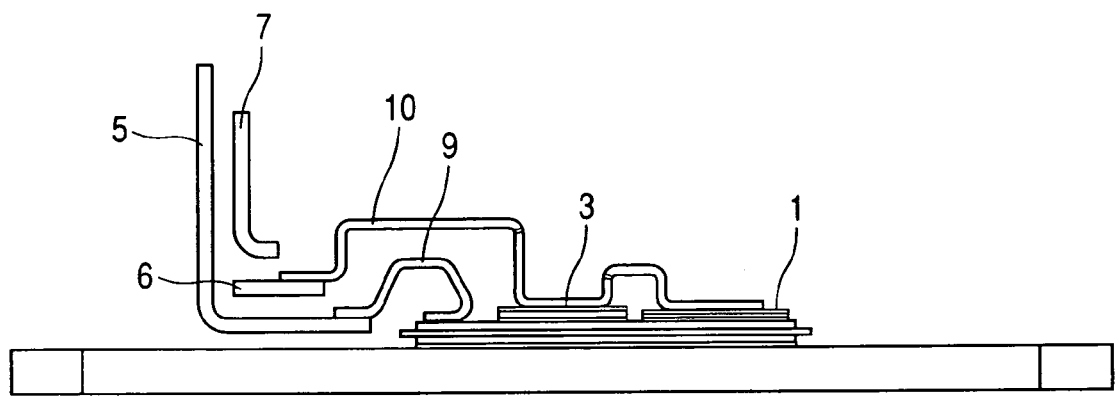
FIG. 7 is a cross-sectional view, taken along line A-A' of FIG. 6, of the semiconductor device of the second embodiment of the invention.
Figure 8:
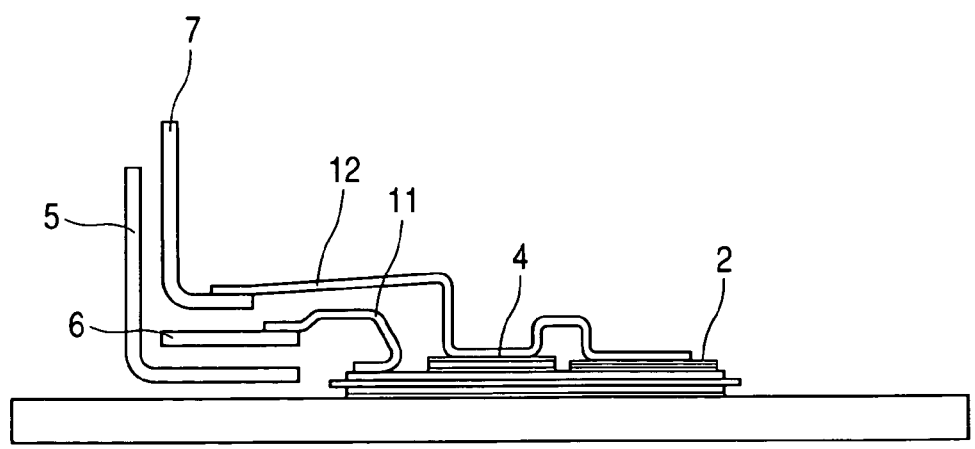
FIG. 8 is a cross-section, along line B-B' of FIG. 6, of the semiconductor device of the second embodiment of the invention.

A configuration and operation of a semiconductor device in accordance with a second embodiment of the invention will be described with reference to FIGS. 5 to 8. A perspective view of the semiconductor device 29 is shown in FIG. 5, which uses a group of four high voltage side circuit elements (IGBTs 1) and a group of four low voltage side circuit elements (IGBTs 2). A top view of the device is depicted in FIG. 6. Its high voltage side (positive polarity side) and low voltage side (negative polarity side) cross-sections are shown in FIGS. 7 and 8, respectively.

The embodiment shown herein is different from the first embodiment in that the high voltage side (positive side) and low voltage side (negative side) semiconductor circuit element groups are divided with a single power semiconductor element being as a unit while letting low voltage side power semiconductor elements (IGBTs 1 and 2) be disposed alternately.

Figure 23:
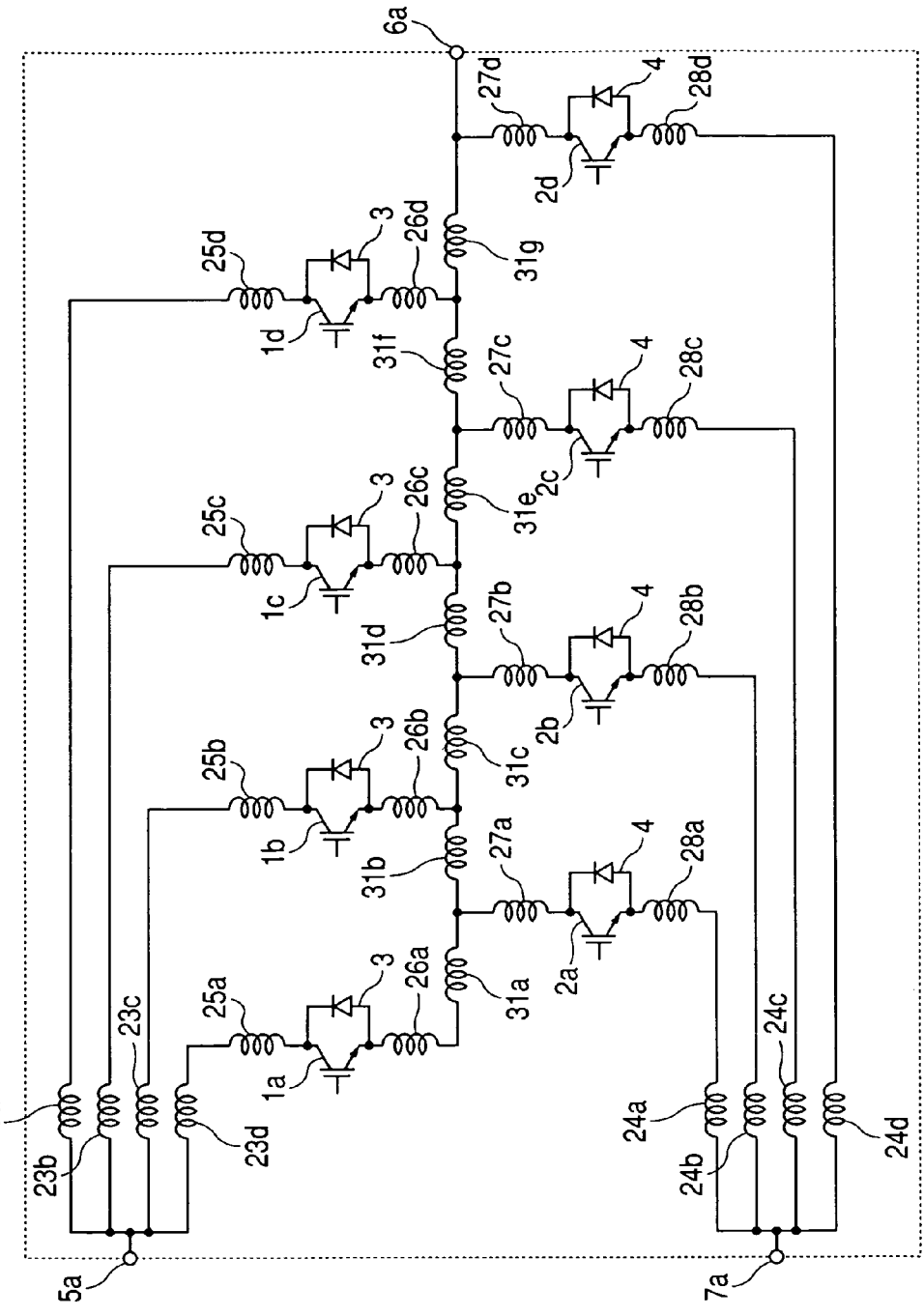
FIG. 23 is a circuit diagram of the semiconductor device of the second embodiment of the invention.

A circuit diagram of this parts-mount structure is shown in FIG. 23. With the illustrative layout of this embodiment, all of those inductances Lo become the same in the event that the current flowing from the high voltage side (positive side) to the low voltage side (negative side) power semiconductor circuit elements (IGBTs 1-2) passes through the output side conductor. Thus it is possible for this embodiment to further lessen the inductance when compared to the configuration of the embodiment 1.

In addition, the alternate layout of the positive and negative side power semiconductor elements (IGBTs 1-2) results in achievement of a structure with enhanced heat dispersion capability. This makes it possible to lower circuit element temperatures at the time motor lock occurs, i.e., in the most severe conditions. Thus, this embodiment is adaptable for use in hybrid cars.

Embodiment 3

Figure 9:
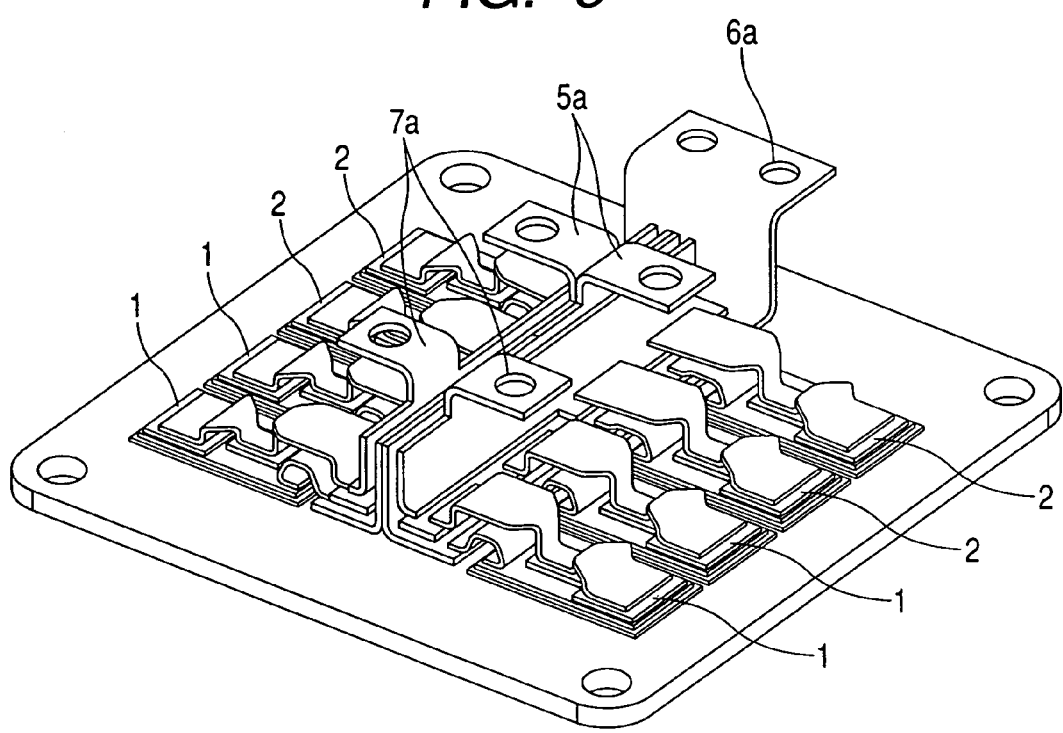
FIG. 9 is a perspective view of a semiconductor device in accordance with a third embodiment of the invention.
Figure 10:
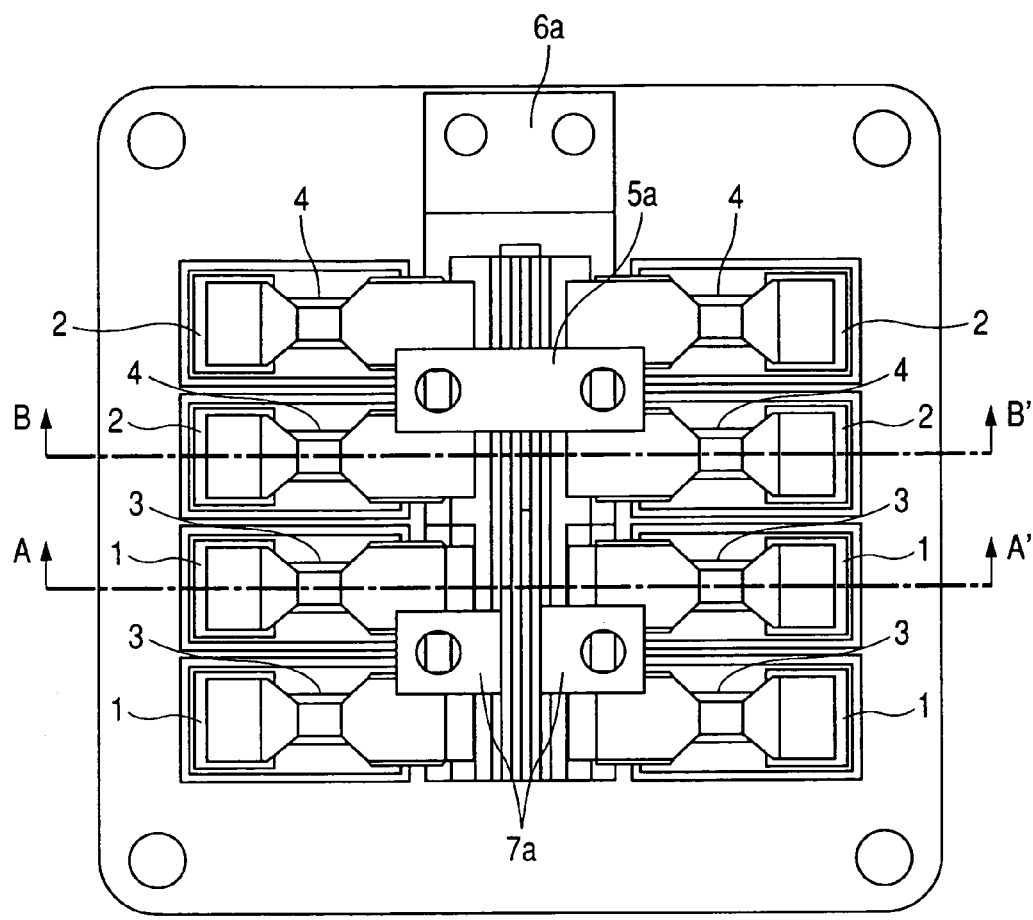
FIG. 10 is a plan view of the semiconductor device of the third embodiment of the invention.
Figure 11:
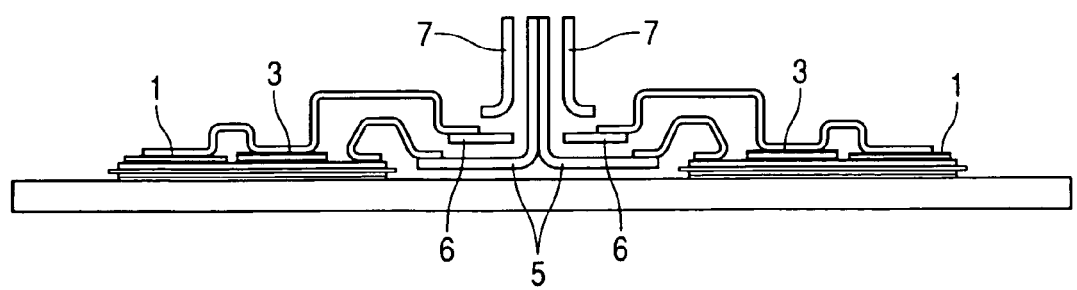
FIG. 11 is a cross-sectional view, along line A-A' of FIG. 10, of the semiconductor device of the third embodiment of the invention.
Figure 12:
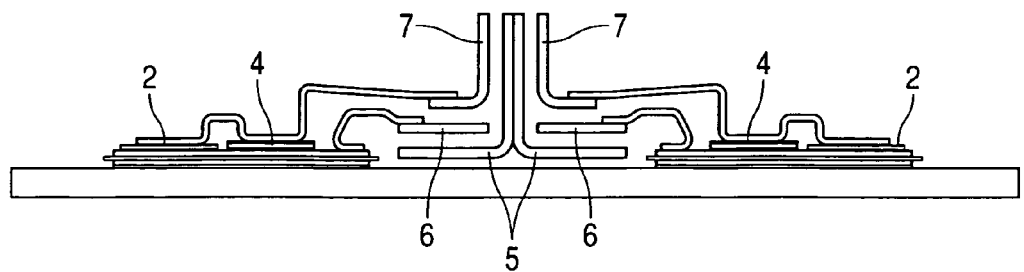
FIG. 12 is a cross-section, along line B-B' in FIG. 10, of the semiconductor device of the third embodiment of the invention.

An explanation will next be given of a configuration and operation of a semiconductor device in accordance with a third embodiment of the invention with reference to FIGS. 9 to 12. A perspective view of the semiconductor device 29 is shown in FIG. 9, which uses a group of four high voltage side circuit elements (IGBTs 1) and a group of four low voltage side circuit elements (IGBTs 2). A top view of the device is depicted in FIG. 10. High voltage side (positive side) and low voltage side (negative side) cross-sections of it are shown in FIGS. 11 and 12, respectively.

This embodiment device is different from the first and second embodiments in that the high voltage (positive) side and low voltage (negative) side power semiconductor circuit elements (IGBTs 1-2) are divisionally organized into more than two—e.g., four—groups of semiconductor circuit elements, which are disposed in a couple of linear arrays so that a positive side conductive plate 5 and an output conductive plate 6 and a negative side conductive plate 7 are interposed therebetween.

More specifically, a first semiconductor element group (IGBTs 1) is laid out along a one side of a second semiconductor element group (IGBTs 2); a third semiconductor element group (IGBTs 1) is aligned along one side of a fourth semiconductor element group (IGBTs 2). The first semiconductor element group (IGBTs 1) and the third semiconductor element group (IGBTs 1) are disposed to oppose each other with a multilayer structure being laterally interposed therebetween. The second semiconductor element group (IGBTs 2) and the fourth semiconductor element group (IGBTs 2) also oppose each other with the multilayer structure laid therebetween.

The first semiconductor element group (IGBTs 1) and the second semiconductor element group (IGBTs 2) are disposed in parallel with the multilayer structure. Similarly, the third semiconductor element group (IGBTs 1) and fourth semiconductor element group (IGBTs 2) are in parallel with the multilayer structure.

The multilayer structure is constituted from a lamination of the positive side conductive plate 5 and the negative side conductive plate 7 with an insulative material 15 being sandwiched therebetween. The positive side conductive plate 5 is provided with a positive side terminal 5a, which is electrically connected to a positive electrode of DC power supply 16. The negative side conductive plate 7 has a negative side terminal 7a, which is electrically coupled to a negative electrode of DC power supply 16.

In this embodiment, the positive side conductive plate 5 has two separate thin plates, i.e., a positive side conductive plate for connection to the first semiconductor element group (IGBTs 1), and a positive side conductive plate for connection to the third semiconductor element group (IGBTs 1). Similarly the negative side conductive plate 7 is also structured from two thin plates.

The output conductive plate 6 is disposed between the first semiconductor element group (IGBTs 1) and second semiconductor element group (IGBTs 2) and between the third semiconductor element group (IGBTs 1) and fourth semiconductor element group (IGBTs 2). The output conductive plate 6 has an output terminal 6a for supplying an output voltage to a load associated therewith. In this embodiment, the output conductive plate 6 is laid out between the positive side terminal 5a and negative side terminal 7a. In this embodiment the output conductive plate 6 also is formed of two thin plates in a similar way to the positive and negative side conductive plates 5 and 7.

Although in this embodiment the positive side conductive plate 5 and the negative side conductive plate 7 plus the output conductive plate 6 are each formed of two thin plates, this invention should not exclusively be limited thereto, and any one or all of these plates 5-7 may alternatively be structured from a single thin plate.

Additionally, although in this embodiment either the first semiconductor element group (IGBTs 1) and the second semiconductor element group (IGBTs 2) or the third semiconductor element group (IGBTs 1) and the fourth semiconductor element group (IGBTs 2) are disposed to oppose each other via the multilayer structure. However, the invention should not exclusively be limited to such arrangement. The first semiconductor element group (IGBTs 1) and fourth semiconductor element group (IGBTs 2) or the second semiconductor element group (IGBTs 2) and third semiconductor element group (IGBTs 1) may alternatively be disposed to oppose each other with the multilayer structure being interposed therebetween.

Employing the embodiment structure makes it possible to lower the inductance, thus enabling achievement of a device structure with enhanced heat dispersion capabilities.

Embodiment 4

Figure 13:
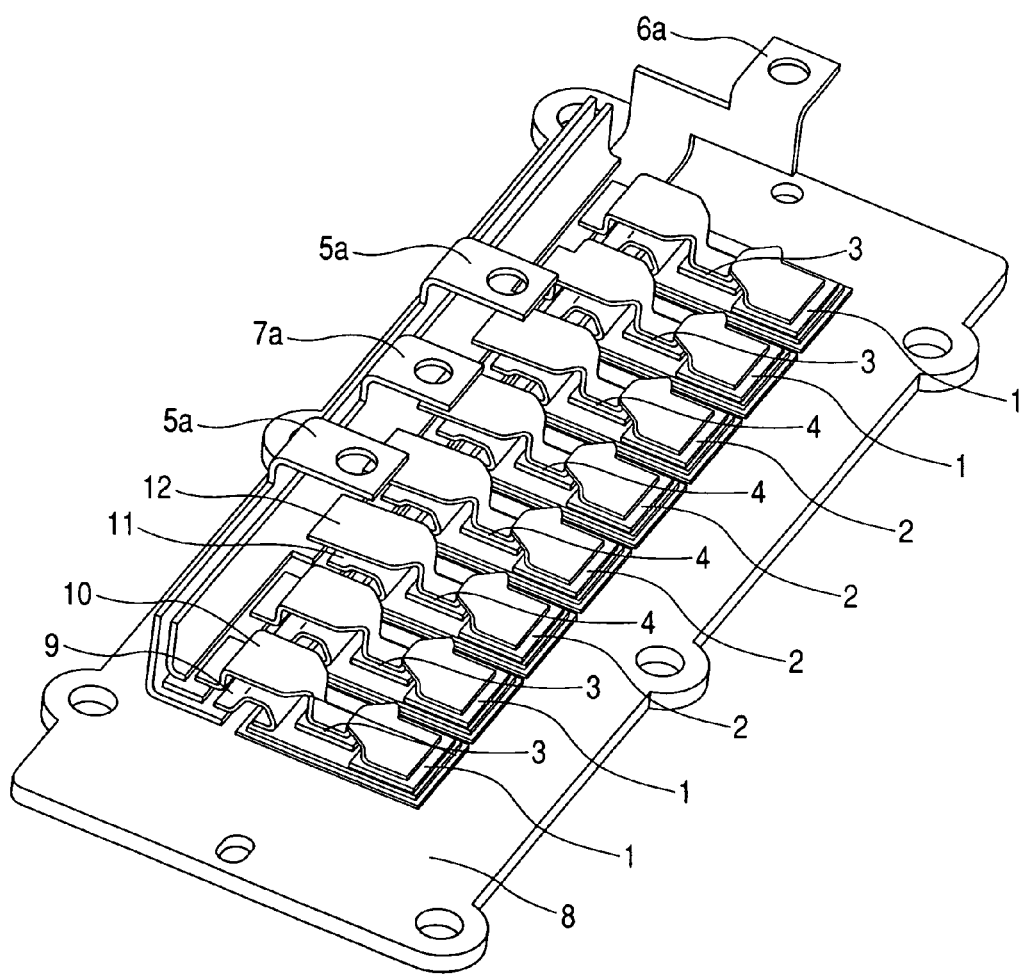
FIG. 13 is a perspective view of a semiconductor device in accordance with a fourth embodiment of the invention.
Figure 14:
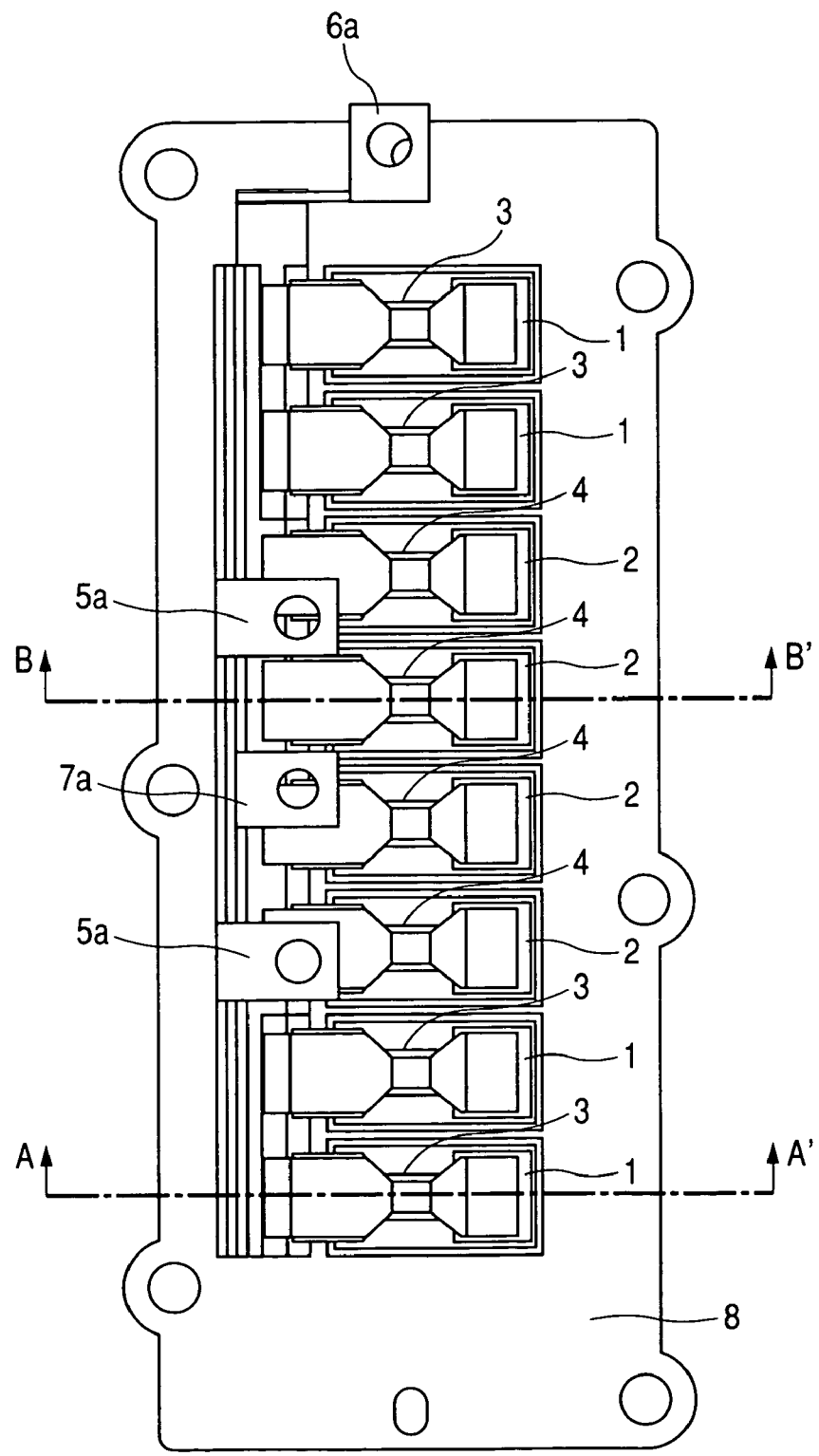
FIG. 14 is a top view of the semiconductor device of the fourth embodiment of the invention.
Figure 15:
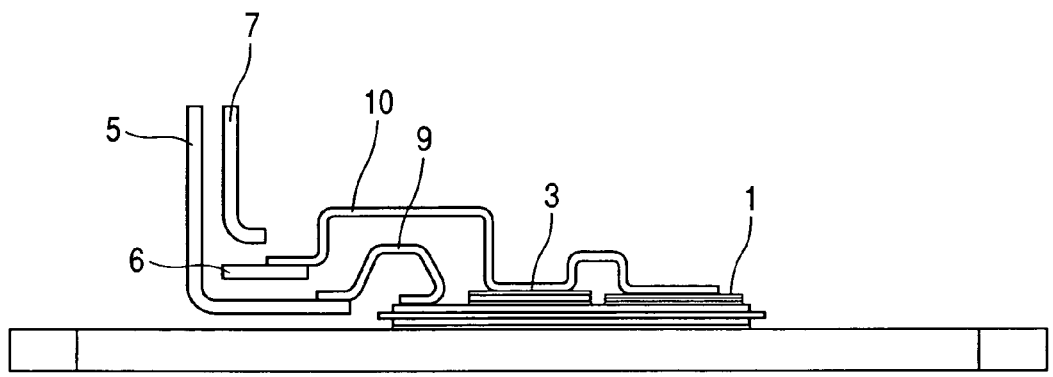
FIG. 15 is a cross-sectional view, along line A-A' of FIG. 14, of the semiconductor device of the fourth embodiment of the invention.
Figure 16:
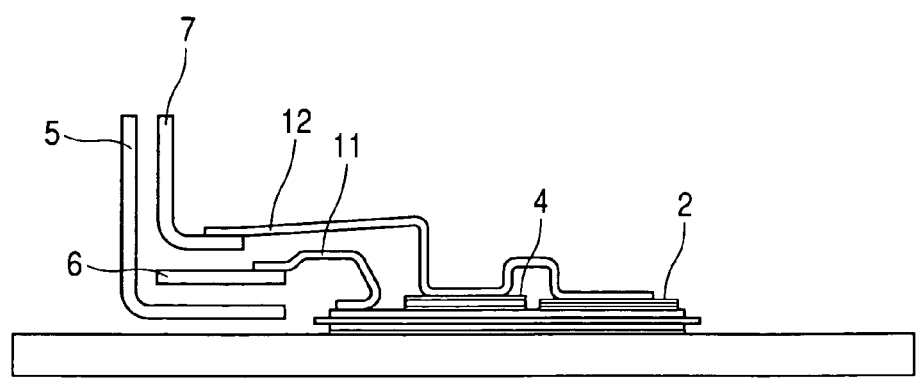
FIG. 16 is a cross-section, along line B-B' in FIG. 14, of the semiconductor device of the fourth embodiment of the invention.

Next, a semiconductor device in accordance with a fourth embodiment of the invention is shown in FIGS. 13 to 16. A perspective view of the semiconductor device 29 is shown in FIG. 13, which uses four high voltage side circuit elements (IGBTs 1) and four low voltage side circuit elements (IGBTs 2). A top view of the device is shown in FIG. 14. Its high voltage (positive) side and low voltage (negative) side cross-sectional structures are shown in FIGS. 15 and 16, respectively.

A difference of this embodiment from the first embodiment is that the positive side terminal 5a is divided into two separate portions, which are linearly arrayed to interpose therebetween the negative side terminal 7a. These positive and negative side terminals 5a and 7a are required to be spaced apart from each other by a prespecified insulation distance, so these are incapable of coming closer to each other. However, in order to lessen the inductance, a need is felt to force them to maximally come closer to each other to thereby further lessen the area of a loop as created by the main circuit's current flow path.

To solve these conflicting problems, this embodiment is arranged to subdivide the high voltage side external connection node (i.e., positive side terminal 5a) into two separate portions while at the same time letting its central position be identical to the location of low voltage side external connection terminal (negative side terminal 7a).

Additionally, by parallel alignment with the power semiconductor circuit elements (IGBTs 1 and 2), the distance of from the external terminal (positive or negative side terminal 5a, 7a) up to the semiconductor elements (IGBTs 1, 2) is averaged, thereby making it possible to further lower the inductance.

Embodiment 5

Figure 17:
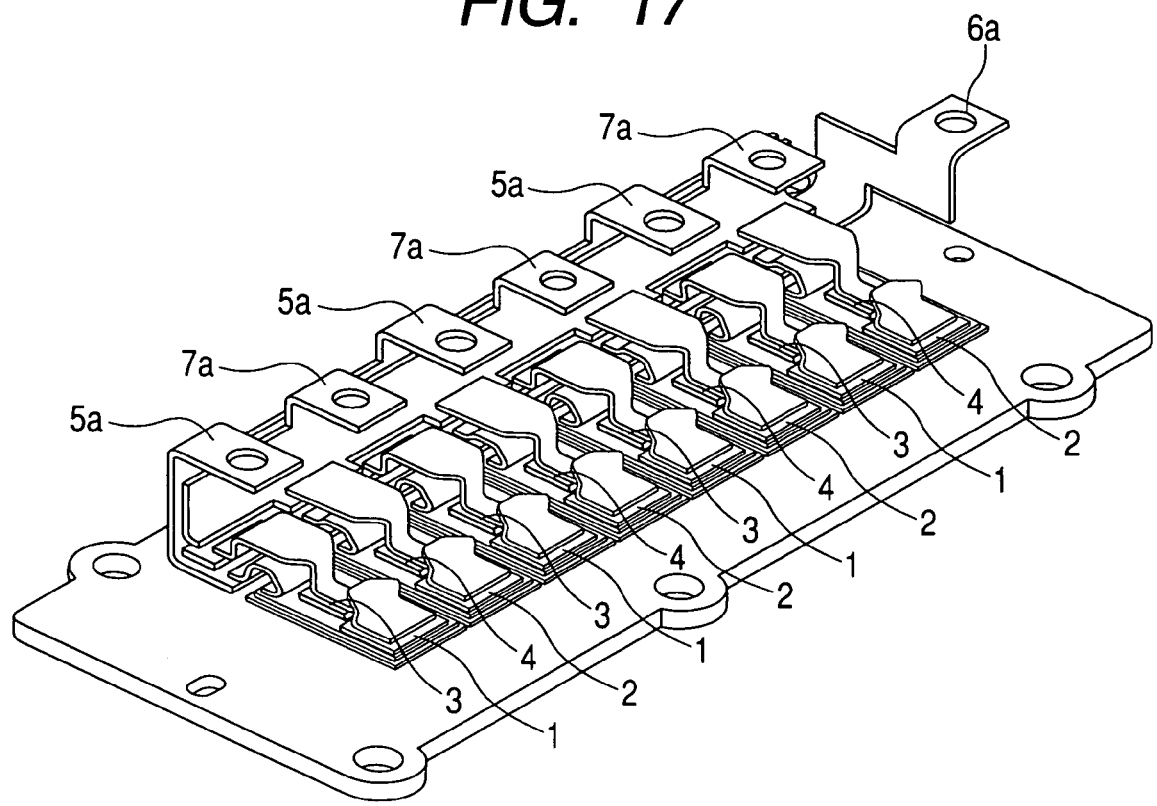
FIG. 17 is a perspective view of a semiconductor device in accordance with a fifth embodiment of the invention.
Figure 18:
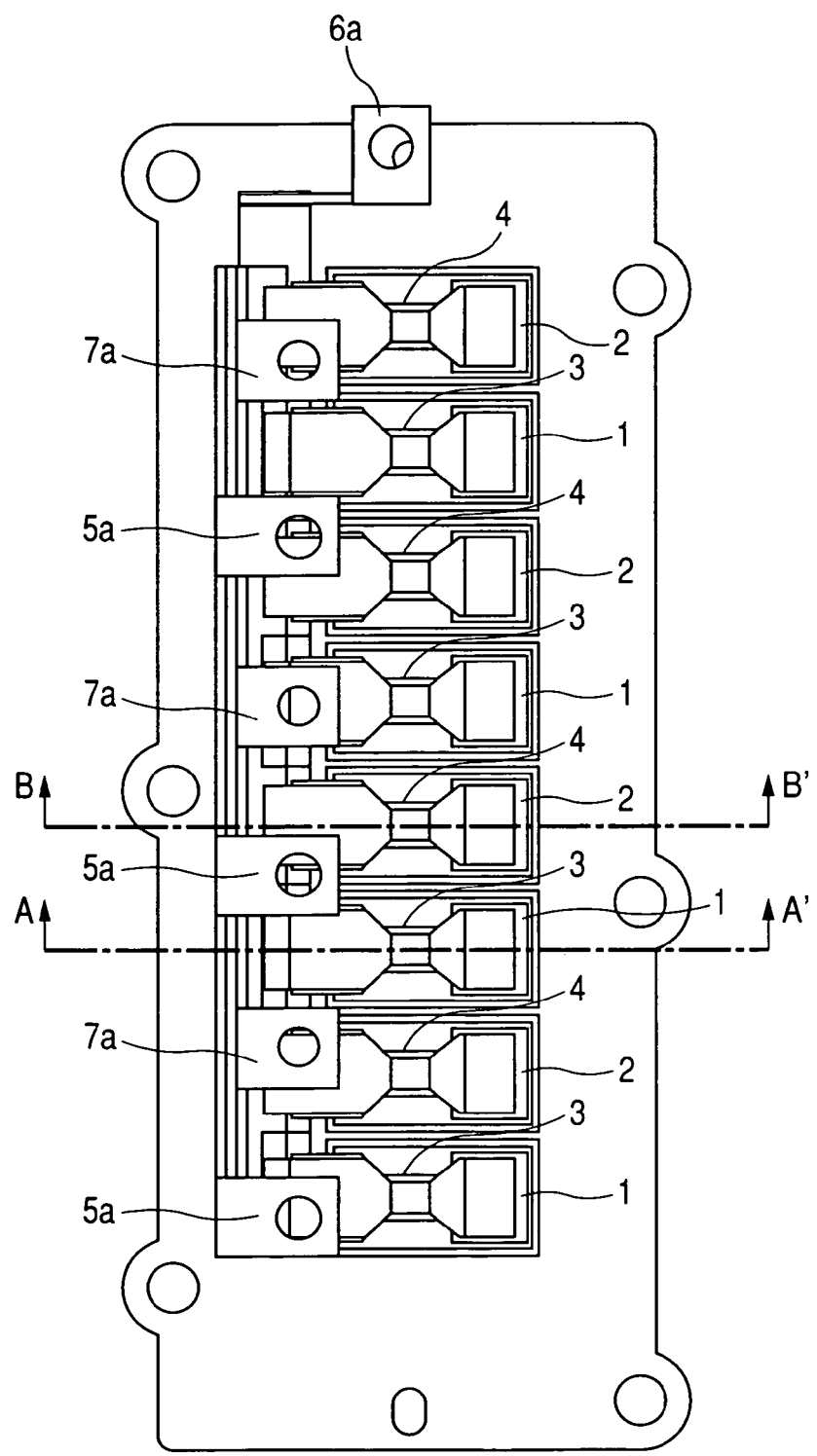
FIG. 18 is a top view of the semiconductor device of the fifth embodiment of the invention.
Figure 19:
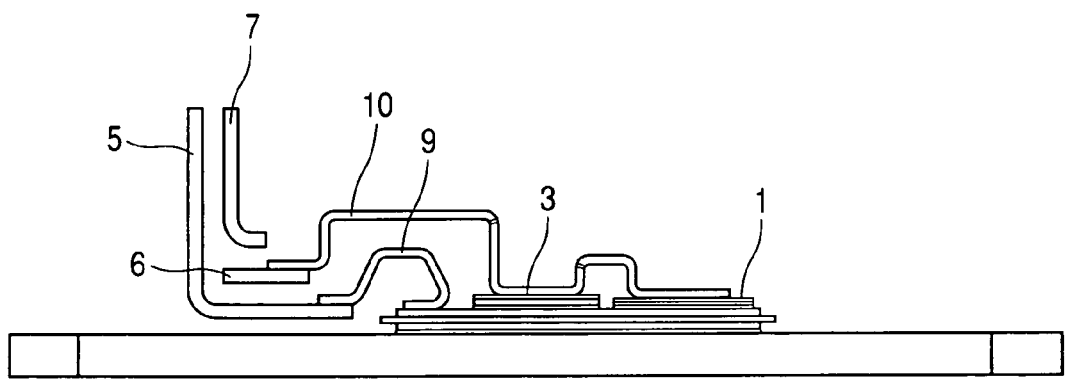
FIG. 19 is a cross-sectional view, along line A-A' of FIG. 18, of the semiconductor device of the fifth embodiment of the invention.
Figure 20:
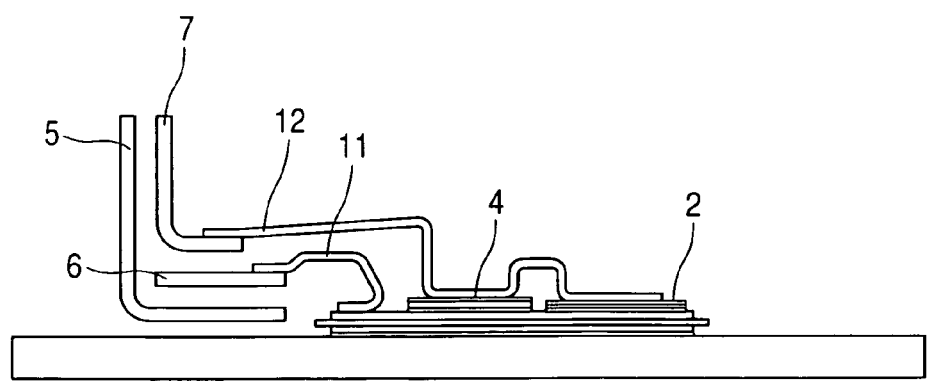
FIG. 20 is a cross-section, along line B-B' in FIG. 18, of the semiconductor device of the fifth embodiment of the invention.

Next, a semiconductor device in accordance with a fourth embodiment of the invention is shown in FIGS. 17 to 20. A perspective view of the semiconductor device 29 is shown in FIG. 17, which uses four high voltage side circuit elements (IGBTs 1) and four low voltage side circuit elements (IGBTs 2). A top view of the device is depicted in FIG. 18. Its high voltage (positive) side and low voltage (negative) side cross-sections are shown in FIGS. 19 and 20, respectively.

A difference of this embodiment from the fourth embodiment is that a plurality of high voltage (positive) side external terminals 5a and a plurality of low voltage (negative) side external terminals 7a are provided so that these are alternately disposed in a line. With such linear alternate positioning, the distances between respective semiconductor circuit elements (IGBTs 1 and IGBTs 2) and their associated external terminals (positive or negative side terminals 5a, 7a) become more uniform. This results in the inductance therebetween being equalized, thus enabling achievement of further inductance reduction.

Embodiment 6

Figure 24:
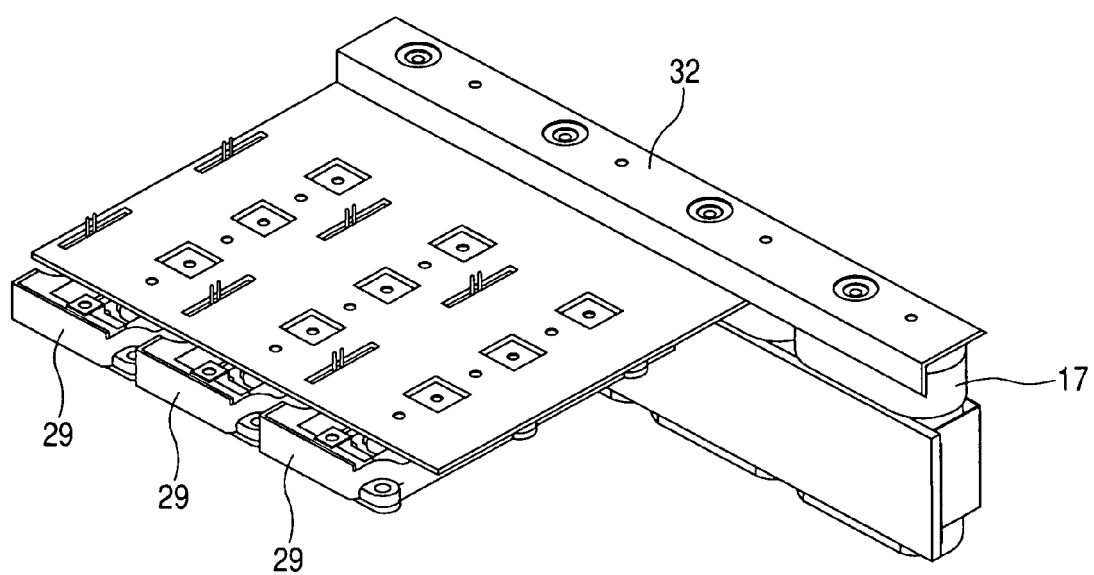
FIG. 24 is a perspective view of a three-phase power converter using three separate semiconductor devices incorporating the principles of the invention.

Turning to FIG. 24, an electrical power conversion apparatus in accordance with a sixth embodiment is shown. This power converter is arranged to use in combination three semiconductor devices 29, each of which is structured in the way stated supra. Owing to the use of these three semiconductor devices 29, the power converter permits respective devices 29 to generate three-phase motor currents of U, V and W phases.

The three semiconductor devices 29 are linearly laid out in a prespecified direction (first direction). A plurality of capacitive elements 17 are in-line disposed along the first direction so that each capacitor 17 is placed next to its corresponding one of the three semiconductor devices 29 in a direction (second direction) at right angles to the direction, along which the semiconductor devices 29 are arrayed.

A respective one of the three semiconductor devices 29 has its positive side terminal 5a and negative side terminal 7a, which are connected via a multilayered conductive flat plate 32 to the positive and negative terminals of its corresponding one of the capacitors 17. The multilayered conductive flat plate 32 is disposed at upper surfaces of the three semiconductor devices 29 to cover these semiconductor devices 29. This plate 32 has a positive side conductive flat plate for electrical interconnection between the positive side terminals 5a of semiconductor devices 29 and the positive electrodes of capacitors 17, and a negative side conductive flat plate for electrically connecting together the negative side terminals 7a of semiconductor devices 29 and the negative electrodes of capacitors 17, which conductive plates are stacked over each other with an insulator sandwiched therebetween.

The multilayered conductive flat plate 32 may be the one that has a single plate for electrical connection between the terminals of the semiconductor devices 29 and the terminals of capacitors 17 or, alternatively, may be the one that has a plurality of plates for such electrical-connection with a connection portion being provided between adjacent ones of the plates.

With the power converter of this embodiment having the structure stated above, the inductance reduction is achievable while increasing the degree of freedom of the mounting layout of capacitors 17.

Although this invention has been described based on some specific embodiments, the invention should not exclusively be limited thereto and may be modifiable and alterable within the scope of its technical concept. For example, although in the above-stated embodiments the power semiconductor circuit elements used therein are IGBTs, these elements may alternatively be other types of power semiconductor elements including, but not limited to, power metal oxide semiconductor field effect transistors (MOSFETs). In the case of such power MOSFETs, external diodes are eliminatable because of the fact that the power MOSFETs have built-in diodes.

Also note that although in the embodiments the connection conductors 9-12 are used to electrically connect respective conductor plates to IGBTs or the like, the invention is not limited thereto, and it is also permissible to replace, entirely or partially, the connection conductors with electrical interconnect wires made for example of aluminum or other similar suitable materials.

According to the embodiments of the invention, it is possible to provide a low-loss semiconductor device capable of attaining both the low inductance and the heat balance at a time and also a power converter using the same.

What is claimed is:

1. A semiconductor device comprising:
   a cooling metal plate;
   a plurality of high voltage side switching elements that are electrically connected parallel to each other and fixed in a line on one surface of the cooling metal plate, each of said plurality of high voltage side switching elements having an attached high voltage side interconnect conductor;
   a plurality of low voltage side switching elements that are electrically connected parallel to each other and fixed in a line on one surface of the cooling metal plate, each of said plurality of low voltage side switching elements having an attached low voltage side interconnect conductor;
   a positive polarity side terminal and a negative polarity side terminal for receiving DC electric power;
   an output terminal for outputting AC electric power; and
   a multilayered conductor that has a positive side conductive plate and a negative side conductive plate which are disposed to oppose each other with an insulator interposed; wherein
   the positive side conductive plate and the negative side conductive plate are electrically connected to the positive polarity side terminal and the negative polarity side terminal, respectively;
   the plurality of high voltage side switching elements are laid out in a line along the multilayered conductor;
   one of said high voltage side interconnect conductors is connected to the positive side conductive plate;
   the remaining high voltage side interconnect conductors are connected to the output terminal;
   the plurality of low voltage side switching elements are laid out in a line along the multilayered conductor;
   one of said low voltage side interconnect conductors is connected to the output terminal, respectively; and
   the remaining low voltage side interconnect conductors are connected to the negative side conductive plate, respectively.

2. The semiconductor device according to claim 1, wherein the cooling metal plate is in square form;
   the multilayered conductor constitutes the form that spreads along one side of the square of the cooling metal plate;
   the plurality of high voltage side switching elements are laid out in a line along one side of the cooling metal plate; and
   the plurality of low voltage side switching elements are laid out in a line along one side of the square of the cooling metal plate.

3. The semiconductor device according to claim 2, wherein one side terminals of the plurality of high voltage side switching elements and the positive side conductive plate are interconnected by conductors that form a thin board, respectively.

4. The semiconductor device according to claim 2, wherein the position in which one of said high voltage side interconnect conductors of the plurality of high voltage side switching elements is connected to the positive side conductive plate and the position in which one of said low voltage side interconnect conducts of the plurality of low voltage side switching elements is connected to the negative side conductive plate are laid out at nearly center of the length of the cooling metal plate in the direction which crosses a right angle to the one side of the square of the cooling metal plate,
   the plurality of high voltage side switching elements are laid out at one side area to an imaginary straight line which crosses a light angle to the one side of the square and separates the square to two equal parts, and the plurality of low voltage side switching elements are laid out at the other side area.

5. The semiconductor device according to claim 4, wherein the plurality of high voltage side switching elements and the plurality of low voltage side switching elements are IGBTs, respectively.

6. The semiconductor device according to claim 5, wherein the positive polarity side terminal and the negative polarity side terminal are terminals that are connected to a capacitor, respectively.

7. A semiconductor device comprising:
   a cooling metal plate;
   a plurality of high voltage side switching elements that are electrically connected parallel to each other and fixed in a line on one surface of the cooling metal plate, each of said plurality of high voltage side switching elements having an attached high voltage side interconnect conductor;
   a plurality of low voltage side switching elements that are electrically connected parallel to each other and fixed in a line on one surface of the cooling metal plate, each of said plurality of low voltage side switching elements having an attached low voltage side interconnect conductor;

a multilayered conductor that has a positive side conductive plate and a negative side conductive plate which are disposed to oppose each other with an insulator interposed;

a positive polarity side terminal that is formed in one with the positive side conductive plate, for receiving DC electric power;

a negative polarity side terminal that is formed in one with the negative side conductive plate, for receiving DC electric power; and an output terminal for outputting AC electric power; wherein the plurality of high voltage side switching elements are laid out in a line along the multilayered conductor;

one of said high voltage side interconnect conductors is connected to the positive side conductive plate;

the remaining high voltage side interconnect conductors are connected to the output terminal;

the plurality of low voltage side switching elements are laid out in a line along the multilayered conductor;

one of said low voltage side interconnect connectors is connected to the output terminal; and the remaining low voltage side interconnect connectors are connected to the negative side conductive plate.

* * * * *